United States Patent [19]

Przybysz et al.

[11] Patent Number: 5,341,136
[45] Date of Patent: Aug. 23, 1994

[54] BANDPASS SIGMA-DELTA MODULATOR FOR ANALOG-TO-DIGITAL CONVERTERS

[75] Inventors: John X. Przybysz, Penn Hills; Donald L. Miller, Penn Township, Westmoreland County, both of Pa.

[73] Assignee: Westinghouse Electric Corp., Pittsburgh, Pa.

[21] Appl. No.: 945,803

[22] Filed: Sep. 16, 1992

[51] Int. Cl.$^5$ .............................................. H03M 1/00
[52] U.S. Cl. ...................................... 341/133; 341/171
[58] Field of Search ....................... 341/133, 143, 171

[56] References Cited

U.S. PATENT DOCUMENTS

| | | | |
|---|---|---|---|
| 4,315,255 | 2/1982 | Harris et al. | 341/133 |
| 4,509,037 | 4/1988 | Harris | 341/143 |
| 4,646,060 | 2/1987 | Phillips et al. | 341/133 |
| 4,672,359 | 6/1987 | Silver | 341/131 |
| 4,983,971 | 1/1991 | Przybysz et al. | 341/133 |
| 5,039,989 | 8/1991 | Welland et al. | 341/143 |
| 5,140,324 | 8/1992 | Przybysz et al. | 341/133 |

OTHER PUBLICATIONS

James C. Candy, "A Use Of Double Integration In Sigma Delta Modulation", *1985 IEEE Transaction On Communications* vol. Com–33, No. 3, Mar. 1985, pp. 249–258.

V. K. Kaplunenko et al., "Experimental Study of the RSFQ Logic Elements", *IEEE Trans. on Magn.*, vol. MAG-25, pp. 861–864, Mar. 1989.

James C. Candy, "A Use of Limit Cycle Oscillations to Obtain Robust Analog-to-Digital Converters", *IEEE Transactions On Communications*, Mar. 1974.

J. C. Candy et al., "Using Triangularly Weighted Interpolation To Get 13-Bit PCM From A Sigma-Delta Modulator", *IEEE Transactions On Communications*, Nov. 1976.

S. R. Norsworthy et al., "A 14–Bit 80–kHz Sigma-Delta A/D Converter: Modeling Design, and Performance Escalation", *IEEE Journal of Solid State Circuits*, vol. 24, No. 2, Apr. 1989.

Konstatin K. Likharev, "Progress And Prospects Of Superconductor Electronics", *Supercond. Sci. Technol.* 3 (1990), pp. 325–337, printed in the UK.

Schreier et al., "Bandpass Sigma–Delta Modulation", *Electronics Letters*, 9th Nov. 1989, vol. 25, No. 23.

E. Hogenauer, "An Economical Class of Digital Filters For Decimation And Interpolation", *IEEE Trans. On Acoustics, Speech, And Signal Processing*, vol. ASSP-29, No. 2, pp. 155–162, Apr. 1981.

*Oversampling Delta–Sigma Data Converters*, ed. J. C. Candy and G. C. Temes, IEEE Press, 1981, ISBNO 0877943-285-8 (Table of Contents).

*Primary Examiner*—Marc S. Hoff
*Attorney, Agent, or Firm*—R. P. Lenart

[57] ABSTRACT

A bandpass sigma-delta modulator for an analog-to-digital converter is provided in which an RLC circuit connected to the input analog signal is resonant at an intermediate frequency. A Josephson junction connected to the RLC circuit receives the current flowing through the RLC circuit. The Josephson junction emits a voltage pulse which reduces the RLC circuit current when the current in the Josephson junction exceeds its critical current. Selected multiples of the voltage pulse generated by the Josephson junction are fed back to the RLC circuit. A digital output is generated from the voltage pulses generated by the Josephson junction to complete the analog-to-digital conversion of the input signal.

6 Claims, 5 Drawing Sheets

BANDPASS SIGMA-DELTA MODULATOR FOR ANALOG-TO-DIGITAL CONVERTERS

BACKGROUND OF THE INVENTION

1. Field of the Invention

This invention relates to analog-to-digital converters, and more particularly, to sigma-delta type analog-to-digital converters implemented with superconducting circuit elements.

2. Description of Related Art

Sigma-delta converters are a class of analog-to-digital converters. The basic sigma-delta converter utilizes an integrator to which the analog signal to be converted is applied. A single rough comparator operating at high speed converts the output of the integrator to a single bit digital signal. The comparator is combined with a digital-to-analog converter to form a quantizer. A digital filter converts the high speed single bit output of the quantizer into a multi-bit digital output. The converter also includes a feedback loop including the comparator, the digital-to-analog converter and the integrator. The quantizer samples the integrator output at a rate many times the Nyquist rate. The rate of the multi-bit output signal is a function of the sampling rate and the number of bits in the output signal. The feedback in the sigma-delta converter integrates the error in the least significant bit thereby shifting quantization noise, which limits the dynamic range in conventional analog-to-digital converters, to frequencies above the frequency of the analog input signal. The chief advantage of sigma-delta converters is that they substitute high speed digital signal processing for the high precision analog circuits required in conventional analog-to-digital converters.

Our commonly owned patent application Ser. No. 07/710,856 filed on Jun. 6, 1991, now U.S. Pat. No. 5,140,324, discloses a sigma-delta converter implemented with superconducting elements and operated with GHz sampling rates to provide high resolution for megahertz signals. This superconducting sigma-delta converter utilizes a superconducting inductor as the integrator, a Josephson junction as the quantizer and a superconducting Quantum Interference Device (SQUID) to generate GHz rate sampling pulses. When the sum of a sampling pulse plus the inductor current generated by the superconducting inductor exceeds a critical current, the Josephson junction generates a voltage pulse which represents a digital "ONE" output. The voltage pulse also provides feedback to the superconducting inductor. This feedback is very precise and stable as each voltage pulse generated by the Josephson junction is a flux quantum.

Our commonly owned patent application Ser. No. 07/807,040 filed on Dec. 12, 1991, now U.S. Pat. No. 5,198,815, discloses a two loop superconducting sigma-delta analog-to-digital converter which includes a first superconducting inductor to which the analog signal is applied. A resistor converts the current in the first inductor to a voltage which is applied to a second superconducting inductor. The current in the second inductor, which increases quadratically with time, is applied to an overdamped Josephson junction which kicks back a single quantum voltage pulse each time its critical current is exceeded. This voltage pulse reduces the current in the second inductor and serves as a digital "ONE" output. The pulses are also applied to an underdamped Josephson junction in a feedback pulse generator which latches at its gap voltage for the remainder of a half cycle of an ac bias current. This provides a voltage source for the primary of a superconducting transformer having a mutual inductance which provides sufficient flux in the secondary to cause a SQUID to generate in response to each pulse from the quantizer a selected number of feedback pulses which are applied to the first inductor.

Sigma-delta analog-to-digital converters substitute high-speed digital signal processing for high-precision analog components to achieve high-dynamic range. Commercially available silicon sigma-delta modulators give 18–24 bits in the audio band. Sigma-delta analog-to-digital converters use oversampling and digital filtering to obtain this performance. Semiconductor sigma-delta analog-to-digital converters are limited to sampling at MHz rates by the requirement of providing twenty-bit accurate feedback. Consequently, 18–24 bit accuracies have only been obtained for signal bands of a few kHz.

Semiconductor sigma-delta analog-to-digital converters were developed for the high-performance audio market. Audio signals are inherently base band, having a band from near d.c. to about 25 kHz. Their function is naturally low-pass. In the typical sigma-delta analog-to-digital converter, shown in FIG. 1, the anti-aliasing filter 2 that precedes the modulator 4 is low-pass, and so is the final digital filter 6. Performed synchronously by means Of sampling clock 8, an input analog signal is converted to a digital signal at the Nyquist rate.

Superconductor sigma-delta modulators employ quantum mechanical feedback to enable sample rates in the 1–100 GHz range. This makes it possible to obtain 18–24 bits of dynamic range for signal band widths up to 25 MHz.

Superconductor sigma-delta analog-to-digital converters open up the possibility of digitizing wide portions of the rf spectrum, for example, 16 bits on a 60 MHz signal band, for high dynamic range digital radio receivers. These signals are not inherently base band. Furthermore, it is not a simple matter to mix these signals to base band. Practical 90 dB phase-linear image rejection filters with 400–1000 MHz center frequencies have large shape factors. When the filtered signal is subsequently mixed to base band, a large frequency band extending from d.c. contains aliased information. This reduces the effective bandwidth of a base band analog-to-digital converter to a fraction of its potential.

Bandpass sigma-delta modulators are a relatively new idea intended to apply sigma-delta techniques to rf receivers. Sigma-delta modulators use oversampling and active filtering to develop a high signal-to-noise ratio in the signal band. Typically, this is a low pass band. In bandpass modulators, the maximum suppression of quantization noise must occur at an intermediate frequency, such as 150 MHz. Consequently, there is a need for a sigma-delta modulator for a band pass operation.

SUMMARY OF THE INVENTION

A bandpass sigma-delta modulator is provided having maximum suppression of quantization noise in the intermediate frequency. This is accomplished with an LC circuit that resonates at the intermediate frequency. The analog signal voltage to be converted is applied to a resistor. This analog signal is converted to a current signal which is applied to the LC circuit including a superconducting inductor to produce an increasing current. The current from the inductor is applied to a Josephson junction quantizer which emits a voltage pulse which reduces the inductor current when current flowing through the Josephson junction quantizer exceeds the critical current of the junction. Feedback means connected to the Josephson junction generates a selected number of feedback pulses for each pulse generated by the quantizer junction. These feedback pulses reduce the current passing through the resistor and reduce the voltage on the resonant capacitor by a constant decrement.

DETAILED DESCRIPTION OF THE PREFERRED EMBODIMENTS

Figure 1:
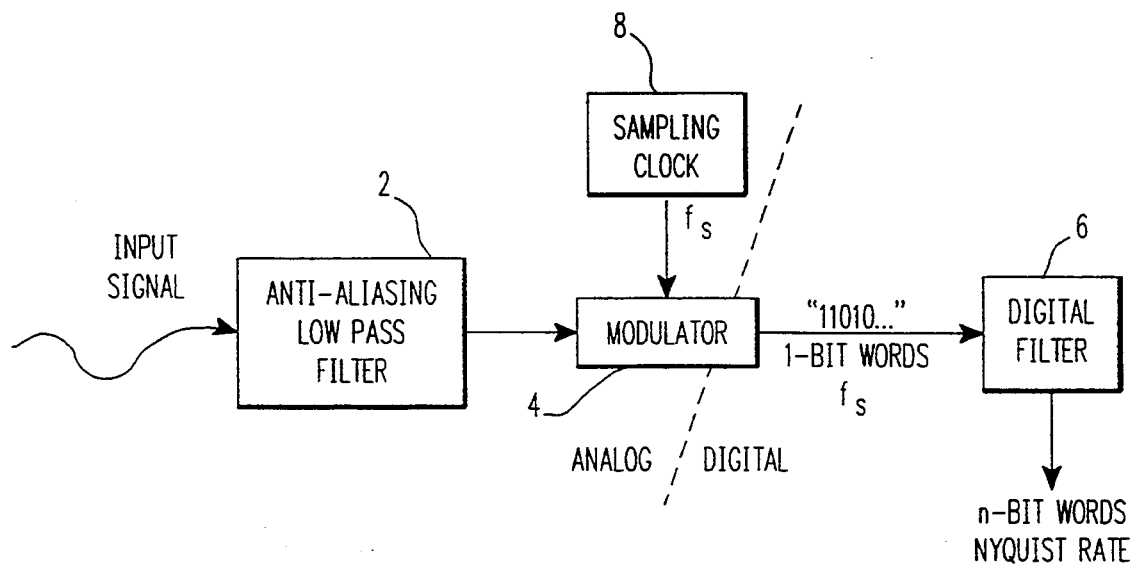
FIG. 1 is a schematic representation of a prior art low pass sigma-delta analog-to-digital converter for digitization of base band signals.
Figure 2:
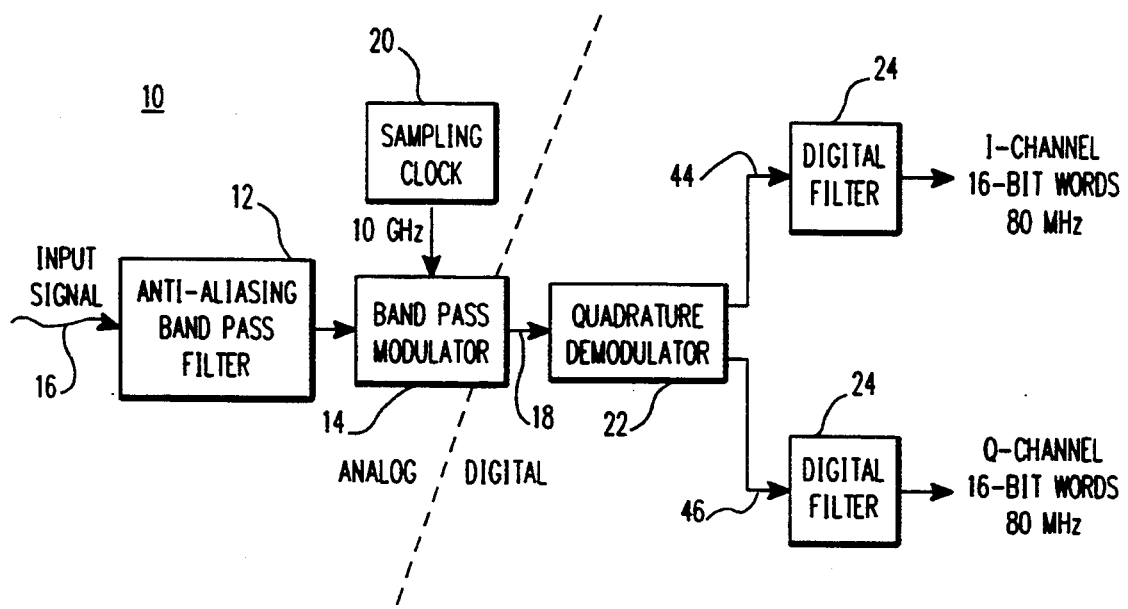
FIG. 2 is a schematic representation of a presently preferred embodiment of a bandpass sigma-delta analog-to-digital converter for digitization of pass band signals.

FIG. 2 illustrates a bandpass sigma-delta analog-to-digital converter 10 for digitization of pass band signals. In converter 10, the anti-aliasing filter 12 that precedes modulator 14 is bandpass. An input analog signal 16 is synchronously converted to a digital signal 18 by means of a sampling clock 20. A quadrature demodulator 22 and digital filters 24 are provided to reduce the data rate, preferably to the Nyquist rate.

Figure 3:
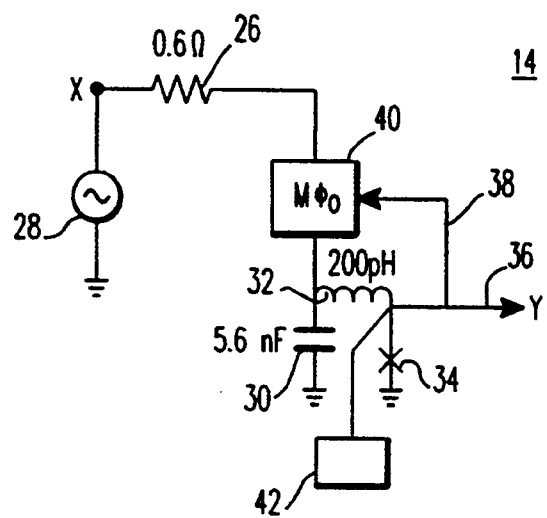
FIG. 3 is a schematic representation of a first presently preferred embodiment of the bandpass sigma-delta modulator for an analog-to-digital converter of the present invention.

FIG. 3 illustrates a bandpass sigma-delta modulator 14 for the analog-to-digital converter 10 in accordance with the present invention. The modulator 14 includes a resistor 26 to which the analog voltage to be converted, such as a voltage produced by source 28, is applied. The current then acts on an LC circuit having capacitor 30 and inductor 32 to form an increasing current. This increasing current flows through a Josephson junction 34 to ground. The Josephson junction 34 acts as a comparator. When the current through Josephson junction 34 exceeds the critical current of the junction, it goes into a voltage state momentarily. This back voltage drops the current in inductor 32 below the critical current of Josephson junction 34 and an output voltage pulse will be produced at output line 36 indicating a digital "ONE". Josephson junction 34 and inductor 32 form an inner loop of modulator 14. An outer loop of modulator 14 is formed by lead 38 and feedback pulse generator 40. Pulse generator 40 generates multiple pulses from the pulse generated by Josephson junction 34. The multiple pulses generated by pulse generator 40 reduce the current in resistor 26 for one sampling interval which reduces the voltage on capacitor 30 by a repeatable decrement.

The voltage pulse produced by Josephson junction 34 is the size of a flux quantum (h/2e) where h is Planck's constant and e is the electron charge and is thus, very precise. Each of the multiple voltage pulses produced by pulse generator 40 is also the size of a flux quantum.

In the modulator 14 of FIG. 3, the pulses generated by Josephson junction 34 are synchronized by a sampling pulse generator 42. Sampling pulses generated by pulse generator 42 add to the current from inductor 32 flowing through Josephson junction 34. On pulses for which the total current through junction 34 exceeds the Josephson junction critical level, the Josephson junction 34 emits a voltage pulse which produces a digital "ONE" on output line 36. On sampling pulses for which the total current through junction 34 does not exceed the junction critical voltage, a "ZERO" output appears on the output line 36. Thus, sampling pulse generator 42 provides clock pulses which define the bits of digital output signal.

Figure 4:
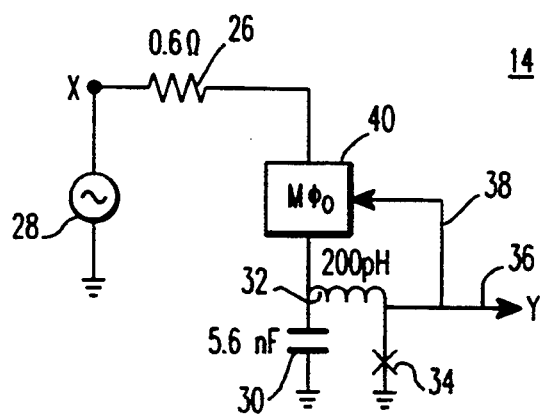
FIG. 4 is a schematic representation of a second presently preferred embodiment of the bandpass sigma-delta modulator for an analog-to-digital converter in accordance with the present invention.

FIG. 4 shows an alternative embodiment of modulator 14 in which the analog to digital conversion is done asynchronously. Aside from the missing sampling pulse generator, the modulator 14 of FIG. 4 contains all the other remaining elements of FIG. 3.

The signal appearing on output line 36 is a single digital signal at the clock rate of the sampling pulse generator 42. A digital quadrature demodulator 22 is used after the bandpass modulator 14 to extract the in-phase 44 and quadrature-phase 46 signals from the modulator output 18 as shown in FIG. 2. The two digital output data streams 44, 46 from the quadrature demodulator 22 then pass through separate digital filters 24 to reduce the data rate, preferably to the Nyquist rate. Suitable digital filters 24 to reduce the data rate are described in Eugene B. Hogenauer, "An economical class of digital filters for decimation and interpolation," IEEE Trans. on Acoustics, Speech, and Signal Processing, Vol. ASSP-29, No. 2, pp. 155–162, April 1981. The number of bits in the multi-bit output signal generated by such a filter depends upon the oversampling rate of the pulses generated by the sampling pulse generator 42. The RLC network of modulator 14 shows them to have a natural resonance in the intermediate frequency.

An example of such a network for modulator 14 is shown by the values in FIG. 3. In accordance with the RLC circuit shown in FIG. 3, a resistor 26 of 0.6 ohms, a capacitor 30 of 5.6 nF, and an inductor 32 of 200 pH have a natural resonance at 150 MHz and a full width at half maximum of 60 MHz, the desired pass band width. Feedback pulse generator 40 feeds back M flux quanta each time the value of output line 36 equals "ONE". The z-transform of the filter transfer function for the bandpass modulator shown in FIG. 3 is as follows;

$$\left[1 - Z^{-1}\left(1 - \frac{T}{RC}\right) + Z^{-2}\left(\frac{T^2}{LC} + \frac{MT}{RC}\right)\right]Y =$$

$$Z^{-1}\frac{T^2}{LRC}X + \left[1 - Z^{-1}\left(2 - \frac{T}{RC}\right) + \right.$$

$$\left. Z^{-2}\left(1 - \frac{T}{RC} + \frac{T^2}{LC}\right)\right]E$$

where:
R = resistance of resistor 26;
L = inductance of inductor 32;
C = capacitance of capacitor 30;

M=number of pulses generated by feedback pulse generator 40;
X=input voltage;
Y=output digits ("ONE" or "ZERO");
E=quantization error;
$Z^{-1}$=time delay operator; and
T=sampling interval.

The performance of modulator 14 depends on the number of flux quanta fed back to feedback pulse generator 40. The dependence of signal to noise for modulator 14 was calculated and plotted in FIG. 5. The noise transfer functions are plotted for M (the number of pulses generated by feedback pulse generator 40) =1, M=10 and M=50. They are plotted relative to a 150 MHz signal that is one-quarter of full scale amplitude (−12 dB). Experience shows that −12 dB signals are small enough to suppress unwanted harmonic spurs by at least 100 dB below the signal.

Figure 5:
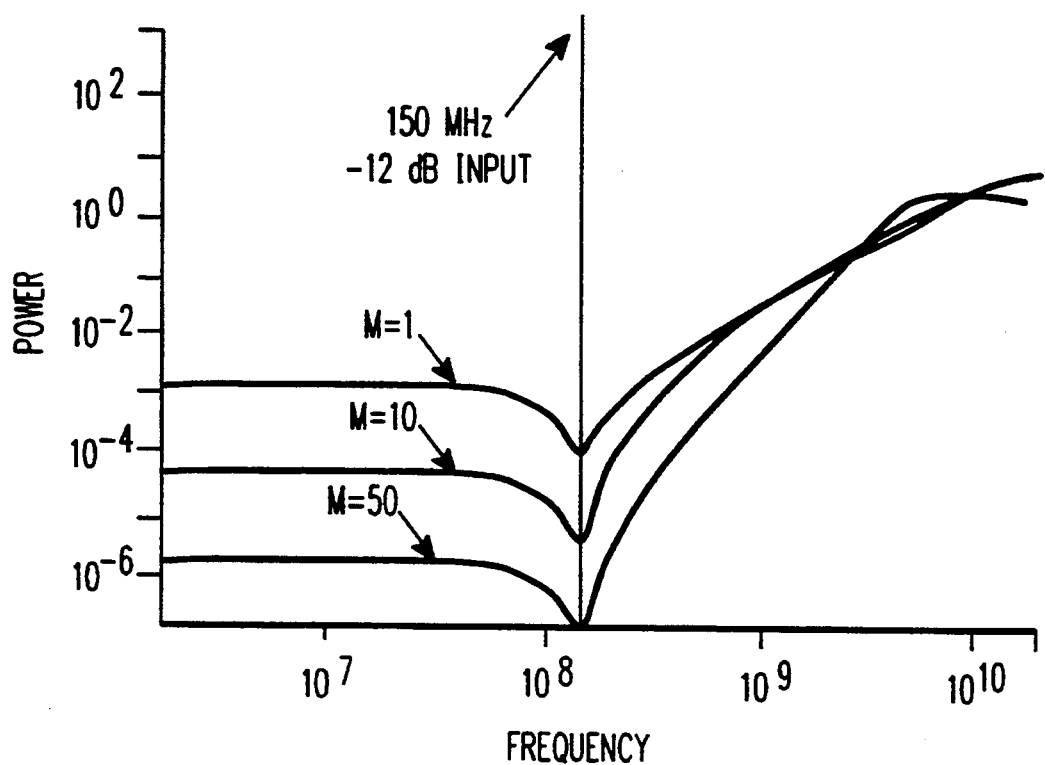
FIG. 5 is a plot of the quantization noise transfer function computed for the bandpass sigma-delta modulator in accordance with the invention.

As shown in FIG. 5, the quantization noise was most strongly depressed in the pass band from 120 to 180 MHz. Scaling of FIG. 5 shows signal and noise power in 60 MHz-wide frequency bands, so that the signal to total in-band noise can be read directly from the graph. For M=1, the signal to total in-band noise is better than 70 dB. For M=50, signal to total in-band noise is greater than 90 dB. For M greater than 80, the magnitude of the noise transfer function exceeds 2, which may lead to unwanted oscillations. Accordingly, this design may be limited to about 16 bits of spur-free dynamic range on the 60 MHz band. Because modulator 14 minimizes quantization noise in the intermediate band, modulator 14 provides an effective bandpass sigma-delta modulator 14 for analog-to-digital converters 10.

Digital receivers that use semiconductor analog-to-digital converters are limited by the 1-2 MHz of signal band that can be obtained with 90 dB of spur-free dynamic range. Channelized receivers are employed to cover wide bands. By utilizing superconductor elements, the present modulator 14 reduces a 60 MHz wide system from thirty sets of receivers, filters, and analog-to-digital converters to one set. The reduced part count and interconnection count greatly simplifies the design and increases the reliability of the digital receiver.

The superconductor-based modulator 14 permits high sampling speeds and digital processing speeds obtained by superconductors. Modulator 14 can operate at 40 GHz sampling speeds and 40 GHz arithmetic speeds. Such speeds are only possible with superconductors. By using superconductor components, modulator 14 can achieve 16 bits of dynamic range at 60 MHz of bandwidth.

In the foregoing specification certain preferred practices and embodiments of this invention have been set out, however, it will be understood that the invention may be otherwise embodied within the scope of the following claims.

We claim:

1. A bandpass sigma-delta modulator analog-to-digital converter for converting an analog input signal to a digital output signal, said converter comprising:
   a. a resistor-inductor-capacitor circuit connected to said analog input signal, said resistor-inductor-capacitor circuit being circuit resonant at an intermediate frequency, said resistor-inductor-capacitor circuit producing a current;
   b. a Josephson junction quantizer connected to said resistor-inductor-capacitor circuit and through which said current passing through said circuit flows, said Josephson junction quantizer emitting a voltage pulse which reduces said current in said circuit when current flowing through said Josephson junction quantizer exceeds a critical current of the Josephson junction quantizer;
   c. feedback means connected to said Josephson junction quantizer and feeding back to said resistor-inductor-capacitor circuit a selected multiple of each voltage pulse generated by said Josephson junction quantizer; and
   d. means for generating said digital output signal from said voltage pulses generated by said Josephson junction quantizer.

2. The converter of claim 1 wherein said means generating said digital output signal comprises timing means defining bits of said digital output signal, said bits being set to a digital ONE in the presence of said voltage pulse and to a digital ZERO in the absence of said voltage pulse, and means generating a multi-bit output signal from said bits defined by said timing means.

3. The converter of claim 1 wherein said resonance circuit is resonant at 150 megahertz.

4. A bandpass sigma-delta modulator analog-to-digital converter for converting an analog input signal to a digital output signal, said converter comprising:
   a. a resonant circuit connected to said analog input signal, said resonant circuit including an inductor and a capacitor, said resonant circuit being resonant at an intermediate frequency, said resonant circuit producing a current;
   b. a Josephson junction quantizer connected to said resonant circuit and through which said current passing through said circuit flows, said Josephson junction quantizer emitting a voltage pulse which reduces said resonant circuit current when current flowing through said Josephson junction quantizer exceeds a critical current of the Josephson junction quantizer;
   c. feedback means connected to said Josephson junction quantizer and feeding back to said resonant circuit a selected multiple of each voltage pulse generated by said Josephson junction quantizer; and
   d. means for generating said digital output signal from said voltage pulses generated by said Josephson junction quantizer.

5. The converter of claim 4 wherein said means generating said digital output signal comprises timing means defining bits of said digital output signal, said bits being set to a digital ONE in the presence of said voltage pulse and to a digital ZERO in the absence of said voltage pulse, and means generating a multi-bit output signal from said bits defined by said timing means.

6. The converter of claim 4 wherein said resonance circuit is resonant at 150 megahertz.

* * * * *